United States Patent
Wuidart et al.

(10) Patent No.: US 7,453,717 B2
(45) Date of Patent: Nov. 18, 2008

(54) THREE-STATE MEMORY CELL

(75) Inventors: Sylvie Wuidart, Pourrieres (FR); Luc Wuidart, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/350,575

(22) Filed: Feb. 9, 2006

(65) Prior Publication Data

US 2006/0126373 A1    Jun. 15, 2006

Related U.S. Application Data (62) Division of application No. 10/697,957, filed on Oct. 30, 2003, now Pat. No. 7,057,941.

(30) Foreign Application Priority Data

Oct. 30, 2002    (FR)    .................................. 02 13615

(51) Int. Cl.
G11C 11/00    (2006.01)

(52) U.S. Cl. .................. 365/148; 365/100; 365/189.08; 365/189.07

(58) Field of Classification Search .................. 365/148, 365/100, 189.08, 189.07
See application file for complete search history.

(56) References Cited

U.S. PATENT DOCUMENTS

| | | | |
|---|---|---|---|
| 4,146,902 A | 3/1979 | Tanimoto et al. ................ 357/6 |
| 4,404,581 A | 9/1983 | Tam et al. ...................... 357/59 |
| 4,590,589 A | 5/1986 | Gerzberg ..................... 365/100 |
| 5,418,738 A | 5/1995 | Abadeer et al. ............. 365/100 |
| 5,497,119 A * | 3/1996 | Tedrow et al. ............... 327/540 |
| 5,761,110 A * | 6/1998 | Irrinki et al. ................. 365/100 |
| 5,787,042 A * | 7/1998 | Morgan ....................... 365/196 |
| 5,898,617 A * | 4/1999 | Bushey et al. ............. 365/185.2 |
| 6,252,471 B1 * | 6/2001 | Salter et al. .................. 331/179 |
| 6,272,040 B1 * | 8/2001 | Salter et al. .................. 365/158 |
| 6,314,014 B1 | 11/2001 | Lowrey et al. .............. 365/100 |
| 6,424,121 B1 * | 7/2002 | Khouri et al. ................ 320/128 |
| 6,483,734 B1 | 11/2002 | Sharma et al. ................. 365/97 |
| 6,525,978 B2 * | 2/2003 | Weber et al. ................. 365/207 |
| 6,574,129 B1 * | 6/2003 | Tran ............................ 365/94 |
| 6,590,807 B2 * | 7/2003 | Lowrey ....................... 365/175 |
| 6,600,690 B1 * | 7/2003 | Nahas et al. ................. 365/210 |
| 6,608,773 B2 | 8/2003 | Lowrey et al. .............. 365/100 |
| 6,621,729 B1 * | 9/2003 | Garni et al. .................. 365/158 |
| 6,693,826 B1 | 2/2004 | Black, Jr. et al. ............ 365/173 |
| 6,697,294 B1 * | 2/2004 | Qi et al. ....................... 365/210 |
| 6,721,203 B1 * | 4/2004 | Qi et al. ....................... 365/173 |
| 6,781,860 B2 | 8/2004 | Parkinson ................... 365/100 |
| 6,798,684 B2 * | 9/2004 | Low et al. ...................... 365/96 |
| 6,813,177 B2 * | 11/2004 | Lowrey et al. .............. 365/148 |

(Continued)

FOREIGN PATENT DOCUMENTS

EP    0 511 560 A2    11/1992

*Primary Examiner*—Viet Q Nguyen
(74) *Attorney, Agent, or Firm*—Lisa K. Jorgenson; Robert Iannucci; Seed IP Law Group PLLC (57) ABSTRACT

A memory cell with at least two detectable states among which is an unprogrammed state, comprising, in series between two terminals of application of a read voltage, at least one first branch comprising: a pre-read stage comprising, in parallel, two switchable resistors having different values with a first predetermined difference; and a programming stage formed of a polysilicon programming resistor, a terminal of the programming resistor being accessible by a programming circuit capable of causing an irreversible decrease in its value.

33 Claims, 4 Drawing Sheets

U.S. PATENT DOCUMENTS

| | | | |
|---|---|---|---|
| 6,829,188 B2 * | 12/2004 | Baker | 365/205 |
| 6,859,390 B2 * | 2/2005 | Pashmakov | 365/163 |
| 6,870,784 B2 * | 3/2005 | Baker | 365/209 |
| 6,882,699 B2 | 4/2005 | Wuidart et al. | 377/52 |
| 7,002,832 B2 * | 2/2006 | Wuidart et al. | 365/100 |
| 7,124,325 B2 * | 10/2006 | Hartmann et al. | 714/30 |
| 2001/0033196 A1 | 10/2001 | Lennous et al. | 327/552 |
| 2003/0151942 A1 | 8/2003 | Bardouillet et al. | 365/148 |
| 2004/0085182 A1 | 5/2004 | Bardouillet et al. | 338/202 |
| 2004/0136238 A1 | 7/2004 | Wuidart et al. | 365/185.05 |
| 2004/0245547 A1 | 12/2004 | Stipe | 257/200 |
| 2005/0122759 A1 | 6/2005 | Wuidart et al. | 365/94 |

* cited by examiner

THREE-STATE MEMORY CELL

BACKGROUND OF THE INVENTION

This application is a divisional of application Serial No. 10/697,957, filed 10/30/03, now U.S. Pat. No. 7,057,941.

1. Field of the Invention

The present invention relates to the field of memory cells formed in an integrated circuit. More specifically, the present invention relates to the manufacturing of a memory cell in which an unprogrammed state (after manufacturing) of the cell can be made out from two programmed states and, more generally, in which the fact that the memory cell has been programmed to any state after its manufacturing can be made out.

2. Description of the Related Art

Currently, to perform such a function, so-called multiple-level memories associated with a counter over two bits in fusible elements to lock or memorize a first programming are generally used. The interpretation of the two counter bits enables obtaining three states for the memory thus formed.

BRIEF SUMMARY OF THE INVENTION

An embodiment of the present invention provides a memory cell with three states or at least with a detection of an unprogrammed state of the cell, which provides the result over a single bit.

The memory cell avoids use of a counter to isolate the respective cell states.

An embodiment of the present invention also provides a one-time programming memory cell.

The cell is compatible with a matrix arrangement.

An embodiment of the present invention provides a memory cell with at least two detectable states among which is an unprogrammed state. The memory cell includes, in series between two terminals of application of a read voltage, at least one first branch. The first branch includes a pre-read stage comprising, in parallel, two switchable resistors having different values with a first predetermined difference; and a programming stage formed of a polysilicon programming resistor, a terminal of the programming resistor being accessible by a programming circuit capable of causing an irreversible decrease in its value.

According to an embodiment of the present invention, said decrease in the programming resistance value is predetermined and chosen to be greater than said first difference between the resistances of the pre-read stage.

According to an embodiment of the present invention, the cell comprises switches capable of applying a programming voltage greater than the read voltage across the programming resistor.

According to an embodiment of the present invention, the cell comprises at least one switch for isolating the pre-read stage with respect to the programming stage.

According to an embodiment of the present invention, the reading of the cell state is performed in two successive steps during which said switchable resistors of the pre-read stage are alternately selected.

According to an embodiment of the present invention, said terminal of the programming resistor forms a read terminal of the cell capable of being connected to a first terminal of a read amplifier having a second terminal receiving at least one reference voltage chosen to be an intermediary level between the voltage level taken by the read terminal in the two read phases, while the programming resistor is in an unprogrammed state.

According to an embodiment of the present invention, the cell comprises a second branch having a structure identical to the first one, each programmable resistor being connected to the terminal of application of the read voltage opposite to the pre-read stage, by a transistor assembled as a flip-flop with the transistor of the other branch.

According to an embodiment of the present invention, the switchable resistors of the second branch are controllable at the same time as the switchable resistors of the first branch, so that the respective values of the resistors selected in each of the branches are inverted.

According to an embodiment of the present invention, the irreversible value decrease likely to be applied to the programming resistors is chosen to be greater than the sum of the difference between the pre-read resistances and of a third nominal value difference between the programming resistors in an unprogrammed state.

An embodiment of the present invention also provides a method for controlling in read and write mode a memory cell with at least two states.

The foregoing features and advantages of the present invention, will be discussed in detail in the following non-limiting description of specific embodiments in connection with the accompanying drawings.

DETAILED DESCRIPTION OF THE INVENTION

Same elements have been designated with same reference numerals in the different drawings. For clarity, only those elements that are necessary to the understanding of the present invention have been shown in the drawings and will be described hereafter. In particular, the circuits exploiting the possible states of a memory cell according to the present invention or of a network of several memory cells of this type have not been detailed. The present invention may be implemented whatever use is made of the detected state.

Figure 1:
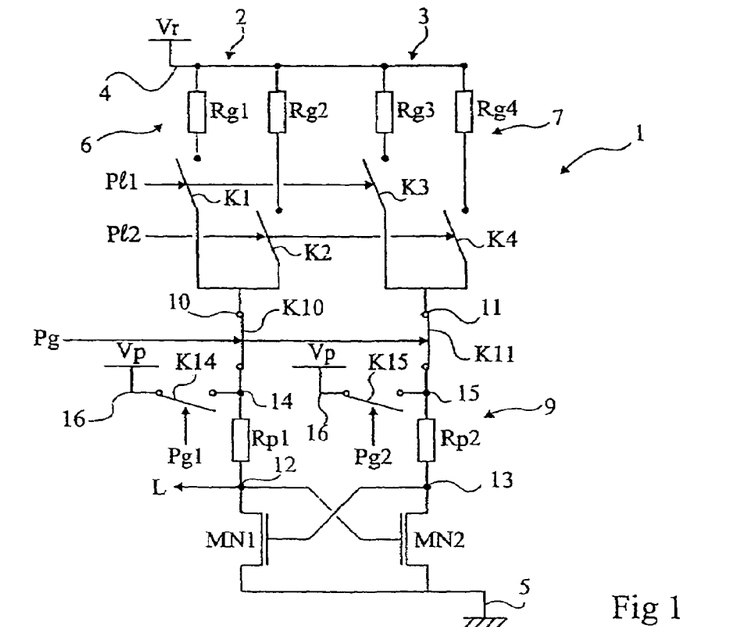
FIG. 1 shows an embodiment of a memory cell according to the present invention.

FIG. 1 shows a first embodiment of a memory cell according to the present invention with at least two detectable states, among which an unprogrammed state.

Cell 1 comprises two identical parallel branches 2, 3 between terminals 4 and 5 of application of a supply voltage Vr, terminal 5 generally representing the ground. Each branch 2, 3 comprises a pre-read stage 6, 7 in series with a programming stage 8, 9, respectively. Each pre-read stage 6, 7 comprises, in parallel between terminal 4 and the corresponding programming stage 8 or 9 (terminal 10, respectively 11) two switchable resistors Rg1 and Rg2, respectively Rg3 and Rg4. The switching of these resistors, that is, the introduction of each of the resistors in the circuit, is ensured by means of a switch K1, K2, K3, or K4, respectively. Switches K1 and K3, which switch resistors Rg1 and Rg3 of branches 2 and 3, are controlled together by means of a first pre-read signal PI1. Switches K2 and K4 of introduction in the circuit of resistors Rg2 and Rg4 are controlled by a second signal PI2.

According to one embodiment of the present invention, resistors Rg1, Rg2, Rg3, Rg4 are chosen to have identical values two by two with a reverse control. In other words, the values of resistors Rg1 and Rg4 are identical, while the values of resistors Rg2 and Rg3 are identical and greater by a predetermined quantity $\Delta Rg$ than the two other resistors.

Each programming stage 8, 9 comprises, in series between the corresponding pre-read stage 6 or 7 (terminals 10, 11), a switch K10, K11 for isolating the pre-read stage from the programming stage, a programmable resistor Rp1, Rp2, and a read confirmation transistor (for example, an N-channel MOS transistor) MN1, MN2. The respective gates of transistors MN1 and MN2 are crossed, that is, the gate of transistor MN1 of branch 2 is connected to junction point 13 of resistor Rp2 with transistor MN2 of branch 3, while the gate of transistor MN2 is connected to junction point 12 of resistor Rp1 with transistor MN1. Junction points 12 and 13 form the respective direct (state L) and reverse output terminals of cell 1.

According to one embodiment of the present invention, resistors Rp1 and Rp2 are polysilicon resistors, the value of which is programmable by irreversible decrease, as will be discussed hereafter in relation with FIGS. 3 and 4. For the time being, it should only be noted that if one of polysilicon resistors Rp1 or Rp2 is submitted to a current greater than the current for which its value is maximum, there is an irreversible decrease in the value of its resistance when it is returned to currents within the nominal operating range. The nominal operating current range of the polysilicon resistors Rp1, Rp2 is smaller than some hundred microamperes and, most often, smaller than some ten microamperes. The amplitude of the programming currents is on the order of one milliampere. A programming current of resistors Rp1 and Rp2 such that it is greater than the current for which the corresponding resistor exhibits a maximum value is obtained by applying, between terminals 12 and 14, respectively 15 and 13, of these resistors, a programming voltage Vp greater than normal supply voltage Vr of the cell. As an alternative, voltage Vp is, as shown in FIG. 1, applied between terminals 14, respectively 15, and ground 5 provided that read transistors MN1 and MN2 can stand the corresponding voltage. The selection of that of resistors Rp1 or Rp2 which is submitted to a programming current is performed by means of switches (for example, MOS transistors) K14, K15 respectively connecting terminals 14 and 15 of resistors Rp1 and Rp2 to a terminal 16 of application of programming voltage Vp.

Programming switches K10 and K11 function to isolate the pre-read stage from a programming of the lower cell stage to protect resistors Rg1 to Rg4 and switches K1 to K4 from the application of a voltage which could be destructive for these components.

According to an alternative embodiment, the role played by switches K10, K11 may be played by switches K1, K2, K3, K4 if the latter can stand the voltage difference between programming voltage Vp and read voltage Vr.

According to one embodiment of the present invention, resistors Rp1 and Rp2 are selected to have nominal values different by a quantity E. The application of programming voltage Vp to one of the two resistors is then chosen to cause a value difference between the programmed resistor and the other resistor remaining at its nominal value, of quantity $\Delta Rp$, greater than quantity E.

The relations between the values of the different resistances and their respective differences are chosen as follows:
difference $\Delta Rg$ between pre-read resistances Rg1 of value Rg and Rg3, respectively Rg4 of value Rg and Rg2, is selected to be greater than the initial (native) imbalance E between programming resistors Rp1 and Rp2, it being ascertained that this relation is respected whatever the manufacturing dispersions between resistances; and quantity $\Delta Rp$ of differentiation of programmable resistors Rp1 and Rp2 is selected to be greater than the sum of difference $\Delta Rg$ between the pre-read resistances and of native difference E between programming resistances Rp1 and Rp2.

Preferably, difference E is chosen to be as small as possible while remaining compatible with technological manufacturing dispersions. In other words, difference E approximately corresponds to the maximum possible technological manufacturing dispersions in all the resistors, including those of the on switches in series therewith.

Figure 2:
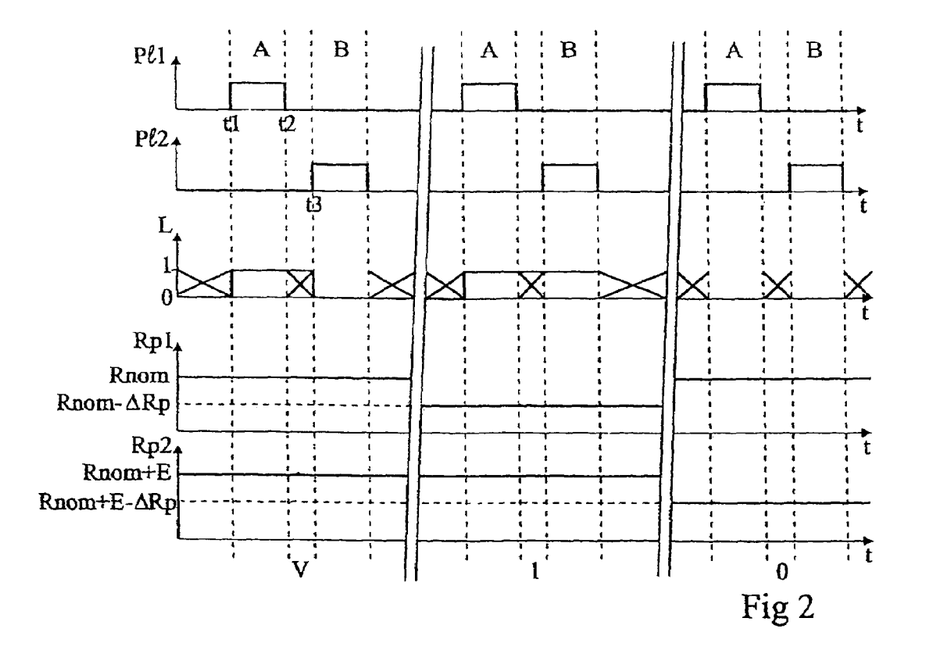
FIG. 2 illustrates, in the form of timing diagrams, the operation of a memory cell such as shown in FIG. 1.

FIG. 2 illustrates, in timing diagrams showing respectively examples of shapes of signals PI1, PI2, and L according to the values of resistors Rp1 and Rp2, the operation of a memory cell 1 such as illustrated in FIG. 1. FIG. 2 shows the three possible cell states, that is: unprogrammed state; programming to state 1; and programming to state 0.

According to one embodiment of the present invention, a reading of the memory cell state is performed in two steps.

In the left-hand portion of FIG. 2, an unprogrammed state of the cell is assumed. In a first step (A), one of signals PI1 or PI2 (for example, signal PI1 at a time t1 where it turns on switches K1 and K3) is activated. It being a reading, it is assumed that switches K10 and K11 are on while switches K14 and K15 are off, as well as switches K2 and K4, signal PI2 and signals Pg1 and Pg2 being in the inactive state. Since resistor Rg3 is equal to Rg +$\Delta Rg$, and resistors Rp1 and Rp2 are in their states just after manufacturing (that is, unprogrammed and exhibiting respective values Rnom and Rnom+ E), the total resistance of branch 2 is equal to Rg +Rnom while the total resistance of branch 3 is equal to Rg +$\Delta Rg$+Rnom +E. This results in an imbalance between the voltages of nodes 12 and 13, the voltage of node 12 being greater than that of node 13. This results in a faster conduction of transistor MN2, which stabilizes the state thus detected by turning off transistor MN1. In this example, state L then is a high state (1). This high state, designated as 1 by convention, is memorized, for example, in a temporary register (not shown) associated with the memory or with the circuit for exploiting the read results. First read step A ends at a time t2 with the turning-off of switches K1 and K3. At a time t3, slightly subsequent to avoid simultaneous conduction in the two resistors of each branch, signal PI2 is activated to turn on switches K2 and K4. The turning-off of switches K1 and K3 between times t2 and t3 has made output state L (node 12) floating (illustrated by a cross in FIG. 2). At time t3, the turning-on of switches K2 and K4 results in that the global resistance of branch 2 is Rg +$\Delta Rg$ +Rnom while the global resistance of branch 3 is Rg +Rnom +E. Since resistors Rg1 to Rg4 are sized for quantity $\Delta Rg$ to be greater than E, the resistance of branch 2 is now greater than that of branch 3. This results in a reversed imbalance of the memory cell in second read step B, the voltage at node 12 being smaller than that of node 13. This low output state (designated as 0 by convention) is, as previously, stabilized by transistors MN1 and MN2.

It can thus be acknowledged that, if with two successive readings of the cell by inverting signals PI1 and PI2, two different successive states are obtained on the same terminal 12, this means that cell 1 is blank, that is, in an unprogrammed state such as just after manufacturing.

Now assume that one of resistors Rp1 or Rp2 (for example, resistor Rp1) has been programmed by irreversible decrease in its value (central portion of FIG. 2). Such a programming is provided to decrease the value by quantity ΔRp.

By reproducing a read cycle formed of the two steps A and B, switches K1 and K3 are first turned on. The total resistance of branch 2 is Rg+Rnom−ΔRp. The resistance of branch 3 is Rg +ΔRg +Rnom +E. The resistance imbalance between the two branches (greater in branch 3) results in a high state on node 12, as previously confirmed by transistors MN1 and MN2. In second read step B (turning-on of switches K2 and K4), the global resistance of branch 2 is Rg+ΔRg+Rnom−ΔRp. The resistance of branch 3 is Rg +Rnom + E. Since ΔRp is greater than ΔRg, the resistance of branch 3 remains greater than the resistance of branch 2. Accordingly, a high state is still present on node 12. There thus is a programmed state 1 which can be well made out from previously-described blank state V.

Now assume a programming by irreversible decrease in its value of resistance Rp2 by a quantity ΔRp, resistance Rp1 remaining at nominal value Rnom (right-hand portion of FIG. 2).

In first read state A, the global resistance of branch 2 is Rg +Rnom while the global resistance of branch 3 is Rg +ΔRg +Rnom +E −ΔRp. Since ΔRp is chosen to be greater than sum ΔRg +E, the resistance of branch 3 is smaller than the resistance of branch 2. This results in a low state L on terminal 12 during the first read step. In the second read step B, the global resistance of branch 2 is Rg +ΔRg +Rnom while the global resistance of branch 3 is Rg +Rnom +E −ΔRp. Since ΔRp is greater than E, the resistance of branch 3 here is still smaller than the resistance of branch 2. A low state L thus appears again in the second read step on terminal 12. This low state corresponds to a programmed state 0 of the memory cell.

It can be seen from the foregoing that the single case where the state of the memory cell read terminal is different in the two read steps is the case where the cell is blank, that is, has never been programmed.

In the foregoing description, no account has been taken of the series resistors in the on switches since these resistances have identical contributions on the two branches (neglecting technological dispersions, which can be taken into account in the determination of quantity E).

It should be noted that memory cell 1 of FIG. 1 could be reprogrammed a limited number of times after a first programming. Indeed, a decrease in the value of that of resistors Rp1 and Rp2 which has not been programmed in a first programming could be caused, either to return to the blank state or to program the cell in a reverse state.

However, in a preferred embodiment of the present invention, especially applied to so-called security applications, it is desired to guarantee that the cell cannot be reprogrammed nor that a blank state can be recovered after a first programming. For this purpose, before performing (allowing) a programming, it must be verified that the reading of output L effectively indicates that the cell is blank.

Figure 3:
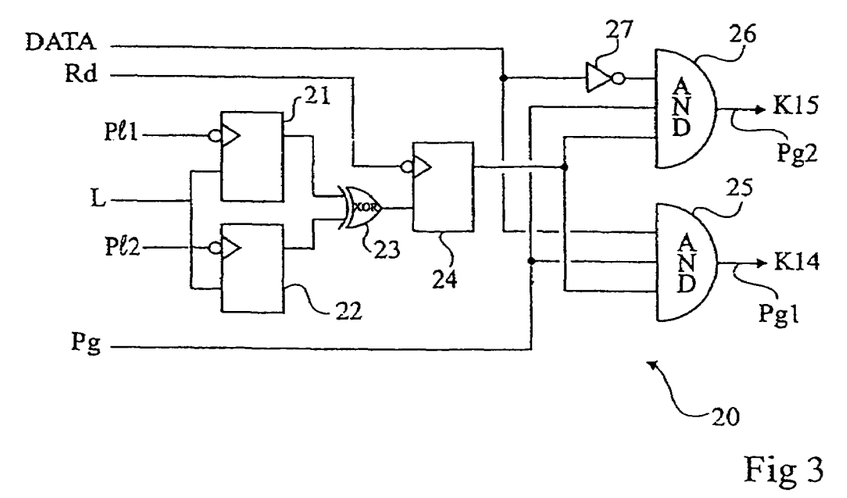
FIG. 3 shows an embodiment of a logic programming control circuit according to the present invention.

FIG. 3 shows an embodiment of a programming control circuit 20 enabling to achieve this aim. In FIG. 3, cell 1 has not been shown. In particular, the circuit of FIG. 3 enables generating control signals Pg1 and Pg2 of switches K14 and K15, in a programming control of a state DATA, identified by a high state on signal Pg.

Circuit 20 comprises two flip-flops 21 and 22 respectively receiving on their clock inputs inverted signals PI1 and PI2, and the data inputs of which are connected to output node 12 of the cell providing signal L. The direct outputs of flip-flops 21 and 22 are connected to the inputs of an XOR-type gate 23.

The output of gate 23 is connected to the data input of a flip-flop 24, the clock input of which receives the inverse of a read control signal Rd, active in the high state. Flip-flop 24 is thus triggered by the falling edge of signal Rd indicating the end of a read cycle. The output of flip-flop 24 is connected to inputs of two three-input AND-type gates 25 and 26, the respective inputs of which provide signals Pg1 and Pg2 for switches K14 and K15. Gates 25 and 26 also receive programming request signal Pg, as well as signal DATA providing the state of the bit to be programmed, signal DATA crossing an inverter 27 before reaching gate 26.

The programming of a state 0 or 1 in cell 1 by the turning-on of one of switches K14 and K15 is only allowed by one of gates 25 and 26 if flip-flop 24 provides a high state. Now, a high output state of flip-flop 24 can only occur if, at the falling edge of signal Rd indicating the end of the read cycle of cell 1, only one of flip-flops 21 and 22 provides a high state. Since flip-flops 21 and 22 are controlled by the respective inverses of signals PI1 and PI2, they read the states present at the output of cell 1 at the end of the two read phases (A and B, FIG. 2). Accordingly, only if the cell is blank will gate 23 provide a high state and allow a programming at the end of the read cycle.

The forming of such a circuit in wired logic enables guaranteeing a single and irreversible programming of cell 1.

As an alternative, the programming current of resistors Rp1 and Rp2 is selected so that the value reached by a programmed resistor is such that the other resistor cannot reach a still lower value (for example, by application of the same constraint current).

An advantage of the cell 1 is that it does not require irreversible recording of a first programming of the memory cell after its manufacturing, making this programming detectable by the analysis of a single output bit of the cell.

Another advantage is that it enables forming a memory cell with three one-time programming states.

Figure 4:
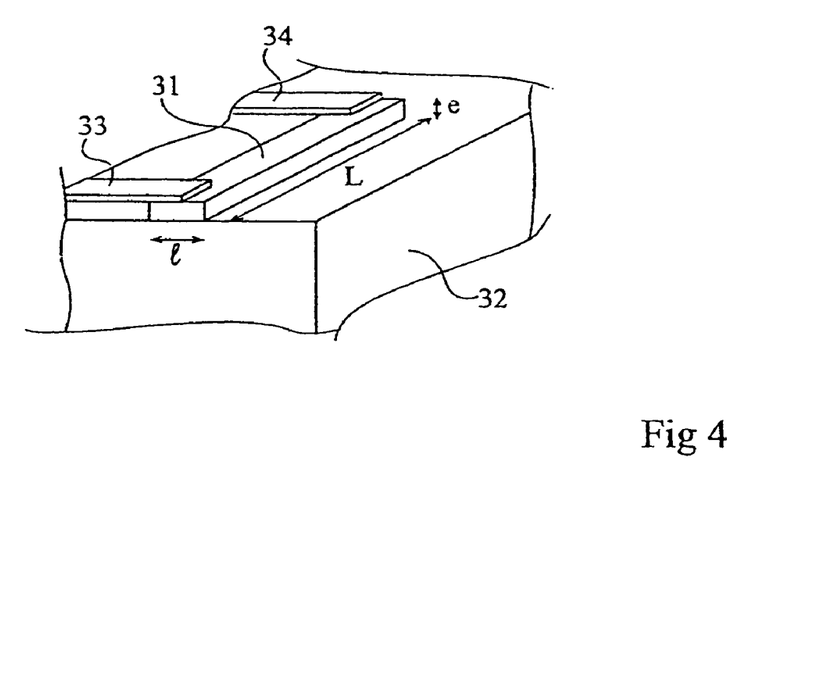
FIG. 4 illustrates in a partial perspective view an embodiment of a polysilicon resistor forming each of the storage elements of the cell of FIG. 1.

FIG. 4 shows an embodiment of a polysilicon resistor forming one of resistors Rp1 or Rp2 of the cell 1.

Such a resistor (designated as 31 in FIG. 4) is formed of a polysilicon track (also called a bar) obtained by etching of a layer deposited on an insulating substrate 32. Substrate 32 is indifferently formed of the integrated circuit substrate or is formed of an insulating layer forming an insulating substrate or the like for resistor 31. Resistor 31 is connected, by its two ends, to conductive tracks (for example, metal tracks) 33 and 34 intended to connect the resistive bar to the other integrated circuit elements according to the application. The simplified representation of FIG. 4 makes no reference to the different insulating and conductive layers generally forming the integrated circuit. To simplify, only resistive bar 31 laid on insulating substrate 32 and in contact, with the ends of its upper surface, with the two metal tracks 33 and 34, has been shown. In practice, the connections of resistive element 31 to the other integrated circuit components are obtained by wider polysilicon tracks starting from the ends of bar 31 in the alignment thereof. In other words, resistive element 31 is generally formed by making a section of a polysilicon track narrower than the rest of the track.

Resistance R of element 31 is given by the following formula:

$$R=\rho(L/s),$$

where ρ designates the resistivity of the material (polysilicon, possibly doped) forming the track in which element 31 is etched, where L designates the length of element 31, and where s designates its section, that is, its width l multiplied by its thickness e. Resistivity ρ of element 31 depends, among others, on the possible doping of the polysilicon forming it.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 31, the resistance is thus given by the following relation:

$$R = R_\square * L/I.$$

Quotient L/I corresponds to what is called the number of squares forming resistive element 31. This represents, as seen from above, the number of squares of given dimension depending on the technology, put side by side to form element 31.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

A feature of one embodiment of the present invention is to temporarily impose, in a polysilicon resistor (Rp), the value of which is desired to be irreversibly decreased, a programming or constraint current greater than a current for which the resistance crosses a maximum value, this current being beyond the normal operating current range (in read mode) of this resistance. In other words, the resistivity of the polysilicon in the operating current range is decreased, in stable and irreversible fashion, by temporarily imposing in the corresponding resistive element the flowing of a current beyond the operating current range.

Another feature is that the current used to decrease the resistance is, conversely to a fusible element, non-destructive for the polysilicon element.

Figure 5:
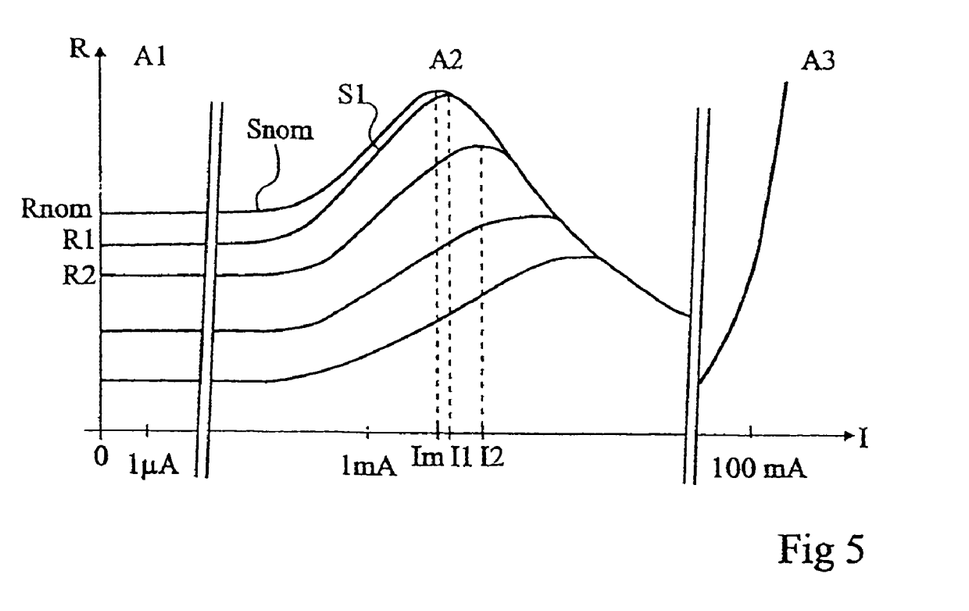
FIG. 5 illustrates, in a curve network, the programming of a storage element such as illustrated in FIG. 4.

FIG. 5 illustrates, with a curve network giving the resistance of a polysilicon element of the type of that shown in FIG. 4 according to the current flowing therethrough, an embodiment of the present invention to program the memory cell resistance.

It is assumed that the polysilicon having been used to manufacture resistive element 31 (Rp) exhibits a nominal resistivity giving element 31, for the given dimensions I, L, and e, a resistance $R_{nom}$. This nominal value of the resistance corresponds to the value taken in a stable manner by resistive element 31 in the operating current range of the system, that is, generally, for currents smaller than 100 µA.

According to an embodiment of the present invention, to decrease the resistance and to switch in an irreversible and stable manner, for example, to a value R1 smaller than $R_{nom}$, a so-called constraint current (for example, I1), greater than a current Im for which the value of resistance R of element 31 is maximum without for all this being infinite, is applied across resistive element 31. As illustrated in FIG. 5, once current I1 has been applied to resistive element 31, a stable resistance of value R1 is obtained in range A1 of operating currents of the integrated circuit. In fact, curve $S_{nom}$ of the resistance according to the current is stable for relatively low currents (smaller than 100 µA). This curve starts increasing for substantially higher currents on the order of a few milliamperes, or even more (range A2). In this current range, curve $S_{nom}$ crosses a maximum for value Im. The resistance then progressively decreases. In FIG. 5, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease occurs in a specific programming phase, outside of the normal read operating mode (range A1) of the integrated circuit, that is, outside of the normal operation of the resistor.

Once the value of the polysilicon resistor has been lowered to a lower value (for example, R1 in FIG. 5), an irreversible decrease in this value may further be implemented. It is enough, to achieve this, to exceed maximum current I1 of the new curve S1 of the resistance according to the current. For example, the value of the current may be increased to reach a value I2. When the current is then decrease again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the curve maximum. Thus, for a given resistive element (ρ, L, s), currents I1, I2, etc. which must be reached, to switch to a smaller resistance value, are independent from the value of the resistance ($R_{nom}$, R1, R2) from which the decrease is caused.

What has been expressed hereabove as the resistance value actually corresponds to a decrease in the resistivity of the polysilicon forming the resistive element. The present inventors consider that the crystalline structure of the polysilicon is modified in a stable manner and that, in a way, the material is reflowed, the final crystalline structure obtained depending on the maximum current reached. In fact, the constraint current causes a temperature rise of the silicon element, which causes its flowing.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to one embodiment of the present invention does not differ from the forming of a conventional resistor. Starting from an insulating substrate, a polysilicon layer is deposited and etched according to the dimensions desired for the resistor. Since the deposited polysilicon thickness is generally determined by the technology, the two dimensions which can be adjusted are the width and the length. Generally, an insulator is redeposited on the polysilicon bar thus obtained. In the case of an on-line interconnection, width I will have been modified with respect to the wider access tracks to be more strongly conductive. In the case of an access to the ends of the bar from the top as shown in FIG. 4, vias will be made in the overlying insulator (not shown) of the polysilicon bar to connect contact metal tracks 33 and 34.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used according to the present invention.

According to a first implementation mode, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the more the jumps between values will be high.

According to a second preferred implementation mode, the different currents to be applied to pass from the different resistance values Rnom and Rnom +E to smaller values Rnom −ΔRp and Rnom +E −ΔRp are predetermined, for example, by measurements. This predetermination takes of course into account the nature of the polysilicon used as well as, preferentially, the square resistance, that is, the resistivity of the material and the thickness with which it is deposited. Indeed, since the curves illustrated by FIG. 5 may also be read as the curves of the square resistance, the calculated values can be transposed to the different resistors of an integrated circuit defined by widths and the lengths of the resistive sections. According to this second embodiment, the value of the constraint current to be applied to the resistive element to decrease its value in an irreversible and stable manner can then be predetermined.

The two above embodiments may be combined. Thus, in a first step, an approximate value may be selected (from a table) and the corresponding predetermined current may be applied. Then, in a second step, the value of the resistance is refined by step-by-step decreases in its value.

The irreversible decrease in the resistance or resistivity may be performed after manufacturing when the circuit is in its functional environment. In other words, control circuit 20 and the programming transistors described in relation with FIGS. 1 and 2 may be integrated with the memory cell(s).

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, any additional duration of application of the constraint current does not modify, at least at the first order, the obtained resistance. Moreover, even if in a specific application, it is considered that the influence of the duration of application of the constraint cannot be neglected, the two preferred embodiments (predetermining constraint values in duration and intensity, or step-by-step progression to the desired value) are perfectly compatible with the taking into account of the duration of application of the constraint.

As a specific example of implementation, an $N^+$-doped polysilicon resistor having a 0.225 square micrometer cross-section (I =0.9 µm, e =0.25 µm) and a 45-micrometer length has been formed. With the used polysilicon and the corresponding doping, the nominal resistance was approximately 6300 ohms. This corresponds to a square resistance of approximately 126 ohms (50 squares). By applying to this resistance a current greater than three milliamperes, a decrease in its value, stable for an operation under currents ranging to 500 microamperes, has been caused. With a 3.1-milliampere current, the resistance value has been lowered to approximately 4500 ohms. By applying to the resistor a 4-milliampere current, the resistance value has been decreased down to approximately 3000 ohms. The obtained resistance values have been the same for constraint durations ranging from 100 microseconds to more than 100 seconds.

Of course, the above example, as well as the given orders of magnitude of currents and resistances for the different ranges concern current technologies. The currents of ranges A1, A2, and A3 may be different (smaller) for more advanced technologies and may be transposed to current densities. The principle of the present invention is not modified. There are still three ranges and the intermediary range is used to force the resistivity decrease.

Programming voltage Vp may be a variable voltage according to whether the programming current levels are predetermined or are unknown and must be obtained by a stepped increase.

According to an alternative embodiment, the programming current forced in resistor Rp is set by the control (gate voltage) of the corresponding programming transistor, voltage Vp being then fixed.

An advantage of one embodiment of the present invention is that a memory cell formed by means of a polysilicon resistor programmable by irreversible decrease in its value is compatible with conventional MOS transistor manufacturing technologies. In particular, neither a floating-gate transistor nor a tunnel structure is necessary for the forming of an EPROM.

Another advantage is that the code stored in the memorization element is not optically detectable, conversely to a polysilicon resistor used as a fuse where the physical deterioration of the silicon bar makes the programming visible.

Another advantage is that the irreversible modification of the value of the programmed resistor is not destructive and does not risk damaging other parts of the circuit. This especially enables providing a decrease in the value of the resistance after manufacturing, and even during its lifetime in its applicative circuit.

Another advantage is that it enables, in an example of application, journaling the integrated circuit chip for the operations which are desired to be monitored and formed in this chip. In particular, by causing the programming of a memory cell such as illustrated in FIG. 1 due to a given action, the case where the action has been judged as being positive or negative by the cell programming can be made out from the case where this action has never occurred since the cell manufacturing.

Preferably, resistors Rg1 to Rg4 are precision resistors of fixed value to be able to provide a ΔRg which is as small as possible while remaining compatible with possible technological dispersions.

Figure 6:
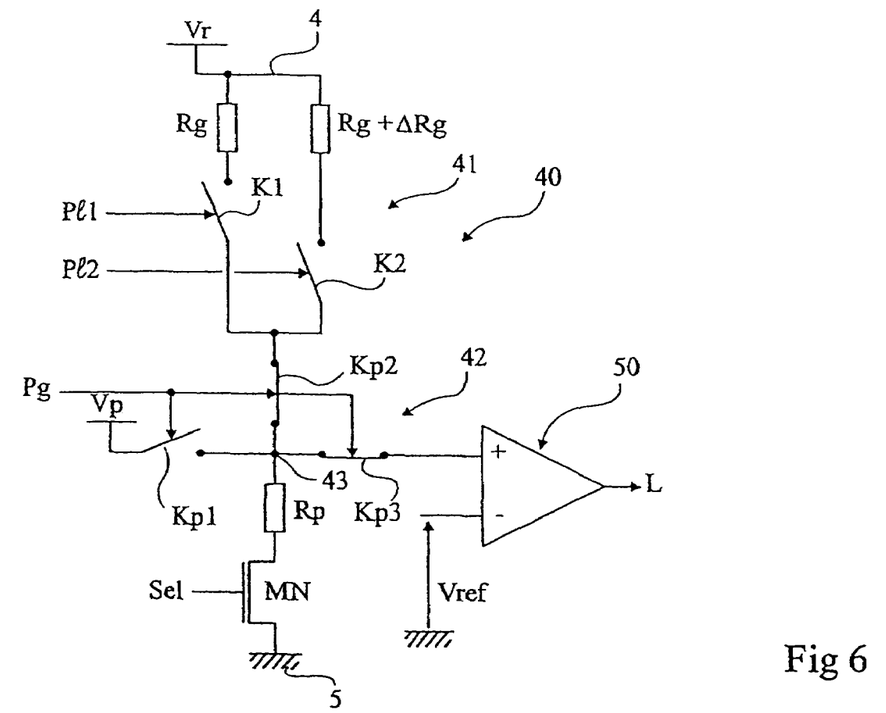
FIG. 6 shows an alternative embodiment of a memory cell according to the present invention.

FIG. 6 shows a second embodiment of a memory cell 40 according to the present invention. This embodiment essentially differs from that of FIG. 1 in that it has a non-differential structure. The equivalent of a single one of the two parallel branches 2 and 3 of FIG. 1 can be found in FIG. 6, this branch comprises a pre-read stage 41 between terminal 4 of application of read voltage Vr and a programming stage 42, programming stage 42 being further connected to ground 5. Pre-read stage 41 comprises two parallel branches each containing resistor Rg and a resistor Rg+ΔRg switchable by switches K1 and K2 associated in series and respectively controlled by signals PI1 and PI2. On the side of programming stage 42, a polysilicon programming resistor Rp likely to be isolated from pre-read stage 41 by a switch Kp2 controlled by a programming signal Pg is found. The programming of resistor Rp is performed by irreversible decrease in its value by applying a voltage Vp thereacross by means of a switch Kp1 connecting voltage Vp to terminal 43 of resistor Rp connected to switch Kp2. In the example of FIG. 6, a selection MOS transistor MN controlled by a signal Sel has been provided. This transistor is here optional but may be used in an arrangement of several memory cells 40 using a same sense amplifier 50. A switch Kp3, controlled by signal Pg, is intended to isolate sense amplifier 50 from resistor Rp in its programming, to avoid damaging it if it does not stand voltage Vp. Such an isolation switch may also be provided in the embodiment of FIG. 1 previously described between terminal 13 and the circuits of interpretation of its state.

According to the embodiment of FIG. 6, node 43 is connected to an input (for example, non-inverting) of sense amplifier 50, the inverting input of this differential amplifier receiving a reference voltage Vref. The output of the differential amplifier provides state L read from cell 40.

To guarantee a detection of a blank state just after manufacturing with respect to a programmed state of cell 40, reference voltage Vref applied on amplifier 50 has a value ranging between Vr*Rnom/(Rg +ΔRg +Rnom) and Vr*Rnom/(Rg +Rnom). With such a threshold, the respective states detected by amplifier 50 in the two successive read steps controlled by signals PI1 and PI2 result in different states, respectively 1 and 0, at the output of amplifier 50.

However, if resistor Rp is programmed by irreversible decrease in its value down to a state Rnom −ΔRp and assuming that quantity ΔRp is selected to be greater than quantity ΔRg, the respective values Vr*(Rnom −ΔRp)/(Rg +Rnom −ΔRp) and Vr*(Rnom −ΔRp)/(Rg +ΔRg +Rnom −ΔRp) present on the non-inverting input of amplifier 50 in the two read steps will be inverted (respectively 0 and 1).

In the embodiment described hereabove, the memory has a single programmed state. Further, it should be noted that the programming is irreversible, in that it is not possible to find the "blank" state by decreasing again the value of resistance Rp.

Figure 7:
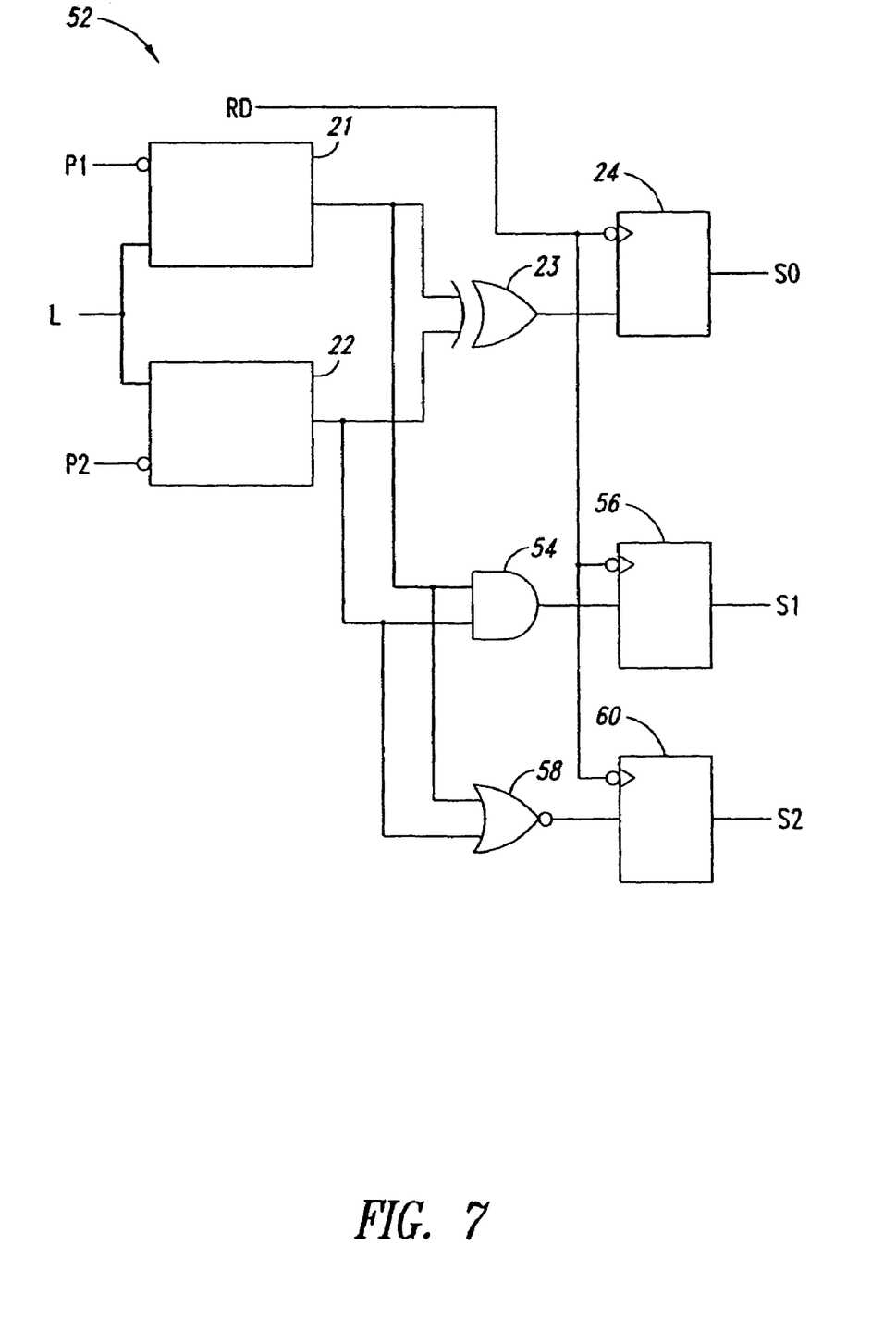
FIG. 7 illustrates an output stage for outputting three states of the memory cell of FIG. 1.

Shown in FIG. 7 is an output stage 52 for reading the state of the memory cell 1 shown in FIG. 1. As discussed above, the memory cell 1 outputs an output level L in each of two reading steps driven by signals PI1 and PI2. The state of the memory cell 1 depends on a comparison of the output levels L at the end of the respective reading steps.

One can notice that the output stage 52 includes first and second flip-flops 21, 22, an XOR gate 23, and a third flip-flop 24 that are connected as in the programming control circuit 20 of FIG. 3. In fact, the same logic gates 21-24 can be used for both circuits 20, 52 or two separate circuits of the same structure could be employed. The output S0 of the third flip-flop provide the unprogrammed, first output state of the memory cell 1.

The output stage 52 also includes an AND gate 54 and a fourth flip-flop 56 with an output S1 that provides a programmed, second output state of the memory cell 1. The AND gate 54 has first and second inputs connected respectively to the outputs of the first and second flip-flops 21, 22. As discussed above, the output of the first flip-flop 21 provides the output level L of the memory cell 1 during the first read step and the output of the second flip-flop 22 provides the output level L of the memory cell 1 during the second read step. When both of its inputs are high, the AND gate 54 provides a high logic level output that is provided at the output S1 of the fourth flip-flop 56 when the fourth flip-flop is clocked by the read signal Rd going low.

The output stage 52 also includes a NOR gate 58 and a fifth flip-flop 60 with an output S2 that provides a programmed, third output state of the memory cell 1. The NOR gate 58 has first and second inputs connected respectively to the outputs of the first and second flip-flops 21, 22. When both of its inputs are low, corresponding to output levels L during the first and second read steps, the NOR gate 58 provides a high logic level output that is provided at the output S1 of the fifth flip-flop 60 when the fifth flip-flop is clocked by the read signal Rd going low.

Those skilled in the art will recognize that the output stage 52 shown in FIG. 7 is only one possible configuration for distinguishing the three output states S0, S1, and S2, and that several other configurations are within the skill in the art based on the disclosure herein. In addition, those skilled in the art will recognize that, by replacing the XOR 23, AND 54, and NOR 58 gates with a logical comparator (not shown), the output stage 52 could be modified to distinguish between the two output stages of the memory cell 40 shown in FIG. 6.

Among the possible examples of application of the present invention, the forming of life-cycle monitors of a product, of managers of irreversibility, of life phases of a chip (validity duration of a credit card, for example), of major alarm memorization, etc. should be mentioned.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

Of course, the present invention is likely to have various alterations, modifications, and improvement which will readily occur to those skilled in the art. In particular, the dimensions given to the different resistors and the read and programming voltage values are within the abilities of those skilled in the art based on the functional indications indicated in the present description. Finally, it should be noted that the present invention can easily be transposed from one technology to another.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for reading a memory cell with first and second memory states, the memory cell including a first programmable resistance element having a programmable resistance, the method comprising:
   driving the first programmable resistance element with a first current and measuring a first electrical quantity at the first programmable resistance element;
   driving the first programmable resistance element with a second current and measuring a second electrical quantity at the first programmable resistance element; and
   detecting the first and second memory states by comparing the first electrical quantity with the second electrical quantity, wherein the detecting step includes:
   detecting the first memory state by detecting that the first electrical quantity logically equals the second electrical quantity; and
   detecting the second memory state by detecting that the first electrical quantity does not logically equal the second electrical quantity.

2. The method of claim 1 wherein detecting the first memory state includes detecting that the first and second electrical quantities are logical high values, the method further comprising detecting a third memory state by detecting that the first and second electrical quantities are logical low values.

3. A method for reading a memory cell with first and second memory states, the memory cell including a first programmable resistance element having a programmable resistance, the method comprising:
   driving the first programmable resistance element with a first current and measuring a first electrical quantity at the first programmable resistance element;
   driving the first programmable resistance element with a second current and measuring a second electrical quantity at the first programmable resistance element; and
   detecting the first and second memory states by comparing the first electrical quantity with the second electrical quantity, wherein the detecting step includes:
   detecting the first memory state by detecting that the first electrical quantity is greater than the second electrical quantity; and
   detecting the second memory state by detecting that the first electrical quantity is less than the second electrical quantity.

4. A method for reading a memory cell with first and second memory states, the memory cell including a first programmable resistance element having a programmable resistance, the method comprising:
   driving the first programmable resistance element with a first current and measuring a first electrical quantity at the first programmable resistance element;
   driving the first programmable resistance element with a second current and measuring a second electrical quantity at the first programmable resistance element; and
   detecting the first and second memory states by comparing the first electrical quantity with the second electrical quantity, wherein driving the first programmable resistance element with the first current includes switching a first switchable resistor into connection between the first programmable resistance element and a first source terminal and driving the first programmable resistance element with the second current includes switching a second switchable resistor into connection between the first programmable resistance element and the first source terminal.

5. The method of claim 4 wherein the switching steps are performed alternately such that the second switchable resistor is disconnected from the first programmable resistance element when the first switchable resistor is connected to the first programmable resistance element and the first switchable resistor is disconnected from the first programmable resistance element when the second switchable resistor is connected to the first programmable resistance element.

6. The method of claim 4, wherein measuring the first electrical quantity includes detecting a voltage level at a first node connecting the first programmable resistance element to a first read transistor connected to a second source terminal, the first read transistor having a control terminal coupled to a first conduction terminal of a second read transistor that has a second conduction terminal connected to the second source terminal and a control terminal connected to the first node such that the voltage level at the first node is a logical high level when current through the second read transistor exceeds the first current and the voltage level at the first node is a logical low level when the first current exceeds the current through the second read transistor.

7. The method of claim 6 wherein the memory cell includes a second programmable resistance element with a programmable resistance, the programmable resistance element being connected to the second read transistor at a second node that is connected to the control terminal of the first read transistor, the method further comprising:
   driving the second programmable resistance element by switching a third switchable resistor into connection between the second programmable resistance element and the first source terminal; and
   driving the second programmable resistance element by switching a fourth switchable resistor into connection between the second programmable resistance element and the first source terminal, wherein:
   measuring the first electrical quantity includes detecting the voltage level at the first node when the first and third switchable resistors are connected between the first source terminal and the first and second programmable resistance elements, respectively; and
   measuring the second electrical quantity includes detecting the voltage level at the first node when the second and fourth switchable resistors are connected between the first source terminal and the first and second programmable resistance elements, respectively.

8. A memory device, comprising:
   a memory cell that includes a first programmable resistance element having a programmable resistance;
   means for driving the first programmable resistance element with a first current and measuring a first electrical quantity at the first programmable resistance element;
   means for driving the first programmable resistance element with a second current and measuring a second electrical quantity at the first programmable resistance element; and
   means for detecting the first and second memory states by comparing the first electrical quantity with the second electrical quantity, wherein the detecting means includes:
   means for detecting the first memory state by detecting that the first electrical quantity logically equals the second electrical quantity; and
   means for detecting the second memory state by detecting that the first electrical quantity does not logically equal the second electrical quantity.

9. The memory device of claim 8 wherein the means for detecting the first memory state includes means for detecting that the first and second electrical quantities are logical high values, the memory device further comprising means for detecting a third memory state by detecting that the first and second electrical quantities are logical low values.

10. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the detecting means includes:
means for detecting the first memory state by detecting that the first electrical quantity is greater than the second electrical quantity; and
means for detecting the second memory state by detecting that the first electrical quantity is less than the second electrical quantity.

11. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

12. The memory device of claim 11, wherein the memory cell includes a second programmable resistance element having a programmable resistance, the memory device further comprising:
a third resistor and a third switch coupled together between the first source terminal and the second programmable resistance element;
a fourth resistor and a fourth switch coupled together between the first source terminal and the second programmable resistance element;
a first transistor connected between the first programmable resistance element and a second source terminal, the first transistor having a control terminal; and
a second transistor connected between the second programmable resistance element and the second source terminal, the second transistor having a control terminal connected to a first node between the first transistor and first programmable resistance element, wherein the control terminal of the first transistor is connected to a second node between the second transistor and second programmable resistance element.

13. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the means for measuring the first electrical quantity includes a sense amplifier having a first input terminal coupled to the first programmable resistance element, a second input terminal coupled to a reference voltage, and an output terminal that provides a logical output indicating whether the first electrical quantity exceeds the reference voltage.

14. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the first programmable resistance element is a polysilicon resistor.

15. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the first programmable resistance element is one-time programmable.

16. A memory device, comprising:
a memory cell that includes a first programmable resistance element having a programmable resistance;
means for driving the first programmable resistance element with a first current and measuring a first electrical quantity at the first programmable resistance element;
means for driving the first programmable resistance element with a second current and measuring a second electrical quantity at the first programmable resistance element; and
means for detecting the first and second memory states by comparing the first electrical quantity with the second electrical quantity, wherein the means for detecting include:
a first flip-flop connected to the first programmable resistance element and structured to store the first electrical quantity;
a second flip-flop connected to the first programmable resistance element and structured to store the second electrical quantity; and a comparator coupled to outputs of the flip-flops and structured to compare the first electrical quantity to the second electrical quantity.

17. A memory device, comprising:
  a memory cell including a first programmable resistance element having a programmable resistance;
  a first switchable resistor coupled between a first source terminal and the first programmable resistance element;
  a second switchable resistor coupled between the first source terminal and the first programmable resistance element;
  a read circuit coupled to the first programmable resistance element and structured to detect a first memory state of the memory cell by comparing a first electrical quantity, at the first programmable resistance element when a first current is driven through the first switchable resistor to the first programmable resistance element, with a second electrical quantity at the first programmable resistance element when a second current is driven through the second switchable resistor to the first programmable resistance element.

18. The memory device of claim 17 wherein the first memory state is detected when the first electrical quantity logically equals the second electrical quantity; and the read circuit is structured to detect a second memory state when the first electrical quantity does not logically equal the second electrical quantity.

19. The memory device of claim 18 wherein the first memory state is detected when the first and second electrical quantities are logical high values, the read circuit being structured to detect a third memory state by detecting that the first and second electrical quantities are logical low values.

20. The memory device of claim 17 wherein the read circuit is structured to detect the first memory state by detecting that the first electrical quantity is greater than the second electrical quantity; and the read circuit is structured to detect a second memory state by detecting that the first electrical quantity is less than the second electrical quantity.

21. The memory device of claim 17, wherein the first switchable resistor includes a first switch connected in series with a first resistor and the second switchable resistor includes a second switch connected in series with a second resistor.

22. The memory device of claim 17, wherein the memory cell includes a second programmable resistance element having a programmable resistance, the memory device further comprising:
  a third switchable resistor coupled between the first source terminal and the second programmable resistance element;
  a fourth switchable resistor coupled between the first source terminal and the second programmable resistance element;
  a first transistor connected between the first programmable resistance element and a second source terminal, the first transistor having a control terminal; and
  a second transistor connected between the second programmable resistance element and the second source terminal, the second transistor having a control terminal connected to a first node between the first transistor and first programmable resistance element, wherein the control terminal of the first transistor is connected to a second node between the second transistor and second programmable resistance element.

23. The memory device of claim 17 wherein the read circuit includes a sense amplifier having a first input terminal coupled to the first programmable resistance element, a second input terminal coupled to a reference voltage, and an output terminal that provides a logical output indicating whether the first electrical quantity exceeds the reference voltage.

24. The memory device of claim 17 wherein the first programmable resistance element is a polysilicon resistor.

25. The memory device of claim 17 wherein the first programmable resistance element is one-time programmable.

26. The memory device of claim 17 wherein the read circuit includes:
  a first flip-flop connected to the first programmable resistance element and structured to store the first electrical quantity;
  a second flip-flop connected to the first programmable resistance element and structured to store the second electrical quantity; and
  a comparator coupled to outputs of the flip-flops and structured to compare the first electrical quantity to the second electrical quantity.

27. The method of claim 3 wherein driving the first programmable resistance element with the first current includes switching a first switchable resistor into connection between the first programmable resistance element and a first source terminal and driving the first programmable resistance element with the second current includes switching a second switchable resistor into connection between the first programmable resistance element and the first source terminal.

28. A method for reading a memory cell with first and second memory states, the memory cell including a first programmable resistance element having a programmable resistance, the method comprising:
  driving the first programmable resistance element with a first current and measuring a first electrical quantity at the first programmable resistance element;
  driving the first programmable resistance element with a second current and measuring a second electrical quantity at the first programmable resistance element; and
  detecting the first and second memory states by comparing the first electrical quantity with the second electrical quantity, wherein the first programmable resistance element is a polysilicon resistor, wherein driving the first programmable resistance element with the first current includes switching a first switchable resistor into connection between the first programmable resistance element and a first source terminal and driving the first programmable resistance element with the second current includes switching a second switchable resistor into connection between the first programmable resistance element and the first source terminal.

29. The memory device of claim 10, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

30. The memory device of claim 13, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

31. The memory device of claim 14, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

32. The memory device of claim 15, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

33. The memory device of claim 16, wherein the means for driving the first programmable resistance element with the first current include a first resistor and a first switch coupled together between a first source terminal and the first programmable resistance element and the means for driving the first programmable resistance element with the second current include a second resistor and a second switch coupled together between the first source terminal and the first programmable resistance element.

* * * * *